(12) United States Patent
Du

(10) Patent No.: US 6,845,135 B2
(45) Date of Patent: Jan. 18, 2005

(54) CASCADED BIQUAD INFINITE IMPULSE RESPONSE FILTER

(75) Inventor: Junchen Du, Allentown, PA (US)

(73) Assignee: Agere Systems Inc., Allentown, PA (US)

(*) Notice: Subject to any disclaimer, the term of this patent is extended or adjusted under 35 U.S.C. 154(b) by 741 days.

(21) Appl. No.: 09/766,735

(22) Filed: Jan. 22, 2001

(65) Prior Publication Data

US 2002/0126750 A1 Sep. 12, 2002

(51) Int. Cl.$^7$ ............................................. H04B 1/10
(52) U.S. Cl. .................... 375/350; 375/232; 708/320
(58) Field of Search ................... 375/232, 229, 375/350; 708/320, 322, 323

(56) References Cited

U.S. PATENT DOCUMENTS

| | | | | | |
|---|---|---|---|---|---|
| 4,521,867 A | * | 6/1985 | Kasuga | ....................... | 708/320 |
| 6,263,354 B1 | * | 7/2001 | Gandhi | ....................... | 708/320 |
| 6,445,735 B1 | * | 9/2002 | Whikehart | ................... | 375/232 |

* cited by examiner

Primary Examiner—Phuong Phu

(57) ABSTRACT

An improved cascaded biquad infinite impulse response (IIR) filter structure is provided. The IIR filter of the invention may be implemented in a digital signal processor (DSP) such as a very long instruction word (VLIW) type DSP, as well as other processing circuitry, e.g., an integrated circuit. The new filter structure, among other advantages, overcomes the bottleneck condition known to occur in the updating operation of the $w_2(n-1)$ state of a conventional cascaded biquad IIR filter. In one illustrative implementation of the invention, this is accomplished by adding a single 32-bit intermediate state thus providing a cascaded biquad IIR filter structure such that the $w_2(n-1)$ state may be updated one clock cycle earlier. Thus, in a StarCore SC140 DSP example where a corresponding conventional cascaded biquad IIR filter structure executes at seven cycles per input sample, the improved cascaded biquad IIR filter structure of the present invention executes at six cycles per input sample. Therefore, without losing any precision, the kernel cycle count associated with the improved cascaded biquad IIR filter structure is advantageously reduced by 14 percent. Such a reduction in kernel count translates to a proportional increase in the processing speed of the DSP or other processing circuitry with which it is implemented.

20 Claims, 11 Drawing Sheets

FIG. 2
PRIOR ART

| | | |
|---|---|---|
| 20 → | asr d0, d0 | move.4f (r0)+, d4: d5: d6: d7 | move.4f (r1), d8: d9: d10: d11 |
| 22 → | mpy d6, d8, d0 | mpy d4, d8, d1 | move.4f (r0), d12: d13: d14: d15 |
| 24 → | mac d7, d9, d0 | mac d5, d9, d1 | mpy d14, d10, d2 | mpy d12, d10, d3 |
| 26 → | mac d15, d11, d2 | mac d13, d11, d3 | add d0, d0, d0 | add d1, d1, d1 |
| 28 → | add d0, d1, d10 | add d2, d2, d2 | add d3, d3, d3 | tfr d10, d7 |
| 30 → | add d10, d2, d6 | tfr d0, d4 | move.f (r1), d5 | |
| 32 → | add d6, d3, d0 | moves.4f d4: d5: d6: d7, (r1) | | |

FIG. 8

| | | |
|---|---|---|
| 60 ⤻ | asr d0, d0 | move.4f (r0)+, d4: d5: d6: d7  move.4f (r1)+, d8: d9: d10: d11 |
| 62 ⤻ | mac d7, d9, d0 | mpy d5, d8, d3      tfr d8, d9                    move.1 (r1), d2  move.4f (r0), d12: d13: d14: d15 |
| 64 ⤻ | mac d6, d8, d0 | mac d14, d10, d2    mac d15, d10, d3              mpy d13, d11, d1  tfra r1, r0 |
| 66 ⤻ | add d0, d0, d8 | add d0, d2, d2      mac d12, d10, d1              tfr d10, d11      suba #8, r0 |
| 68 ⤻ | add d2, d1, d0 | add d2, d2, d10     mac d4, d8, d3 |
| 70 ⤻ | add d0, d0, d0 | move.1 d3, (r1)     moves.4f d8: d9: d10: d11, (r0) |

CASCADED BIQUAD INFINITE IMPULSE RESPONSE FILTER

FIELD OF THE INVENTION

The invention relates to infinite impulse response filters and, more particularly, to a fixed-point structure implementation of a cascaded biquad infinite impulse response filter.

BACKGROUND OF THE INVENTION

The cascaded biquad infinite impulse response (IIR) digital filter has been widely used in the field of communications. For example, such digital filters are used to remove noise, enhance communication signals, and/or synthesize communication signals. Compared to the FIR (finite impulse response) filter, an IIR filter can often be much more efficient in terms of attaining certain performance characteristics with a given filter order. This is because the IIR filter incorporates feedback and is capable of realizing both poles and zeroes of a system transfer function, whereas the FIR filter is only capable of realizing the zeroes.

Higher-order IIR filters can be obtained by cascading several biquad sections (or biquad IIR filters) with appropriate coefficients. Another way to design higher-order IIR filters is to use only a single complicated section. This approach is called the direct form implementation. The biquad implementation executes slower than the direct form implementation but generates smaller numerical errors than the direct form implementation. The biquad sections can be scaled separately and then cascaded in order to minimize the coefficient quantization and the recursive accumulation errors. The coefficients and data in the direct form implementation must be scaled all at once, which gives rise to larger errors. Another disadvantage of the direct form implementation is that the poles of such single-stage high-order polynomials get increasingly sensitive to quantization errors. The second-order polynomial sections (i.e., biquads) are less sensitive to quantization effects.

By way of example, a cascaded biquad IIR filter may be implemented on a very long instruction word (VLIW) digital signal processor (DSP), such as the StarCore SC140. Operations of a cascaded biquad IIR filter on a fixed-point DSP, such as the StarCore SC140 DSP, may include MAC (multiply and accumulate) and scaling operations. As is known, the StarCore SC140 is a third generation DSP architecture that deploys a variable length execution set (VLES) execution model. It contains four data arithmetic and logic units (DALUs) and two address generation units (AGUs). It can run up to six instructions per clock cycle (4 DALUs and 2 AGUs). The StarCore SC140 was jointly developed by Lucent Technologies Inc. (Murray Hill, N.J.) and Motorola Semiconductor (Schaumburg, Ill.). Still further, the cascaded biquad IIR digital filter algorithm has been selected by Berkeley Design Technology Inc. (BDTI) as one of the twelve algorithms to benchmark processor performance (e.g., such as that of the StarCore SC140) for the DSP industry.

A fourth-order cascaded biquad IIR filter has the following transfer function (wherein each stage of the cascaded IIR filter is itself a second-order IIR filter):

$$H(z) = \prod_{i=1}^{2} \frac{1 + b_{i1}z^{-1} + b_{i2}z^{-2}}{1 - a_{i1}z^{-1} - a_{i2}z^{-2}}. \quad (1)$$

It is known that in order to make the filter and the inverse filter stable, both the poles and the zeros of H(z) are restricted to be inside the unit circle. This means that coefficients $b_{i1}$, $b_{i2}$, $a_{i1}$, $a_{i2}$ will be in the range of $[-2, 2]$. FIG. 1 illustrates the architecture of a conventional fixed-point structure of a cascaded biquad IIR filter implementing the transfer function represented in equation (1) above.

It is to be understood that, for fixed-point implementation, a (m+n) bit number is represented in a $Q_{m.n}$ format. The highest bit represents the sign bit. The next (m−1) bits represent the integer part. The lowest n bits represent the fractional part. A multiplication of two fixed-point numbers, $Q_{m1.n1}$ and $Q_{m2.n2}$, produces a $Q_{(m1+m2-1).(n1+n2+1)}$ number. In the conventional implementation of the cascaded biquad IIR filter, (m+n) equals 16 or 32. The input data, coefficients, states and output data are represented with 16 bit precision, and the intermediate data is kept in 32 bit precision. Truncating the lower 16 bits of a 32 bit value produces a 16 bit value. To keep a filter coefficient in the range $[-2, 2]$, the coefficients are represented in a $Q_{2.14}$ format. The input data is represented in a $Q_{1.15}$ format.

As mentioned, FIG. 1 illustrates the architecture of the conventional fixed-point structure of the cascaded biquad IIR filter implementing the transfer function represented in equation (1) above. It is to be understood that certain of the filter operations are first generally described below in the context of FIG. 1 and then all the filter operations are described in detail in the context of FIG. 3 with respect to the instruction code shown in FIG. 2. Thus, with reference to FIG. 1, the "Put_h" operation (reference numeral 2 in FIG. 1) deposits the 16 bit value into the higher 16 bits of the 32 bit register. The "Div_2" operation (reference numeral 4 in FIG. 1) scales down a 32 bit value by one bit. The "Mul_2" (reference numeral 6 in FIG. 1) operation scales up a 32 bit value by one bit. The "Ext_h" operation (reference numeral 8 in FIG. 1) extracts the higher 16 bits of a 32 bit value. Further, $w_1(n-1)$, $w_1(n-2)$, $w_2(n-1)$, and $w_2(n-2)$ (denoted by reference numerals 10, 12, 14 and 16, respectively, in FIG. 1) are the four 16-bit feedback state values for the cascaded biquad IIR filter. It is to be understood that FIG. 1 actually contains two biquad IIR filter stages 1 and 3. The two filter stages 1 and 3 are in a cascaded configuration, thus forming a cascaded biquad IIR filter. The term "biquad" refers to the fact that each filter stage is a second (bi) order filter with four (quad) filter coefficients.

The corresponding SC140 assembly code is shown in FIG. 2. It is to be understood that the code shown in FIG. 2 is the optimized SC140 kernel code when the conventional fixed-point structure shown in FIG. 1 is used to implement the IIR filter. Register "r0" contains the address for the four $Q_{2.14}$ format filter coefficients. Register "r1" contains the address for the four $Q_{1.15}$ format filter states. Execution of this kernel code takes seven cycles per input sample.

In order to explain the data flow associated with the execution of the optimized assembly code of FIG. 2, the nomenclature associated with the filter structure of FIG. 1 is modified, as shown in FIG. 3. Thus, FIG. 3 represents a flow diagram illustrating the data flow of the conventional fixed-point cascaded biquad IIR filter structure shown in FIG. 1. It is to be appreciated that x1(i) denotes that the data is 32 bit long, and xs(i) denotes that the data is 16 bit long.

When the conventional fixed-point structure is used to implement the IIR filter, SC140 DSP takes 7 cycles per input sample. The following is the detailed analysis of the execution of the assembly code. In accordance with the following explanation of FIG. 3, it is to be understood that d0, d1, . . . , d15 are the SC140 DSP's data registers, and r0 and r1 are the pointer registers. A simplified block diagram of the SC140 is shown in FIG. 4, wherein PDB is the program data bus, PAB is the program address bus, ABA is the address bus A, ABB is the address bus B, DBA is the data bus A, and DBB is the address bus B. Further, it is to be understood that the functionality of the adders (each denoted by reference numeral 18 in FIG. 3) and the multipliers (each denoted by reference numeral 19 in FIG. 3) are apparent in the description below of the operation of the IIR filter structure of FIG. 3 when executing the code in FIG. 2. That is, an addition operation provided by an adder 18 is denoted below as "+", while a multiplication operation provided by a multiplier 19 is denoted below as "*". Also, during the description below, reference will be made to FIG. 5, which is a flow diagram summarizing the operation of each step of the filtering process.

1. Initially, data register "d0" keeps (saves, stores, holds, etc.) the value of "x1(0)." Pointer register "r0" points to the address where the 8 coefficient values, $b_{11}$, $b_{12}$, $a_{11}$, $a_{12}$, $b_{21}$, $b_{22}$, $a_{21}$, and $a_{22}$, are held. Pointer register "r1" points to the address where the 4 state values, $w_1(n-1)$, $w_1(n-2)$, $w_2(n-1)$, and $w_2(n-2)$ are held.

2. During cycle 1, SC140 executes the following instruction code (line 20 in FIG. 2): "asr d0,d0 move.4f(r0)+, d4:d5:d6:d7 move.4f(r1),d8:d9:d10:d11" where:

"asr d0,d0" executes "Div_2" and data register "d0" keeps the value of "x1(1);"

"move.4f(r0)+,d4;d5;d6;d7" loads $b_{11}$, $b_{12}$, $a_{11}$, and $a_{12}$ to data registers "d4,""d5," "d6," and "d7;" and "move.4f(r1), d8:d9:d10:d11" loads the 4 state values $w_1(n-1)$, $w_1(n-2)$, $w_2(n-1)$, and $w_2(n-2)$ to data registers "d8," "d9," "d10," and "d11."

The above filter operation is summarized in step 33 of FIG. 5.

3. During cycle 2, SC140 executes the following instruction code (line 22 in FIG. 2): "mac d6, d8, d0 mpy d4, d8, d1 move.4f(r0), d12:d13:d14:d15" where:

"mac d6, d8, d0" executes "x1(1)+$a_{11}$*$w_1(n-1)$=x1(1)+x1(3),"and keeps the result in data register "d0;"

"mvp d4, d8, d1" executes "$b_{11}$*$w_1(n-1)$=x1(7)," and keeps the results in data register "d1;" and "move.4f(r0), d12:d1:d15" loads $b_{21}$, $b_{22}$, $a_{21}$, and $a_{22}$ to data registers "d12," "d13," "d14," and "d15,"

The above filter operation is summarized in step 34 of FIG. 5.

4. During cycle 3, SC140 executes the following instruction code (line 24 in FIG. 2): "mac d7,d9,d0 mac d5,d9,d1 mpy d14,d10,d2 mpy d12,d10,d3" where:

"mac d7,d9,d0" executes "d0+$a_{12}$*$w_1(n-2)$=x1(1)+x1(3)+x1(2)=x1(5)," the result is kept in data register "d0;"

"mac d5,d9,d1" executes "d1+$b_{12}$*$w_1(n-2)$=x1(7)+x1(8)=x1(9)," the result is kept in data register "d1;"

"mpy d14,d10,d2" executes "$a_{21}$*$w_2(n-1)$=x1(12)," the result is kept in data register "d2;" and "mpy d12,d10,d3" executes "$b_{21}$*$w_2(n-1)$=x1(16)," the result is held in data register "d3."

The above filter operation is summarized in step 35 of FIG. 5.

5. During cycle 4, SC140 executes the following instruction code (line 26 in FIG. 2) "mac d15,d11,d2 mac d13,d11,d3 add d0,d0,d0 add d1,d1,d1" where:

"mac d15,d11,d2" executes "d2+$a_{22}$*$w_2(n-2)$=x1(12)+x1(11)=x1(13)," and keeps the value of "x1(13)" in data register "d2;"

"mac d13,d11,d3" executes "d3+$w_2(n-2)$*$b_{22}$=x1(16)+x1(17)=x1(18)," and keeps the value of "x1(18)" in data register "d3;"

"add d0,d0,d0" executes "Mul_2" on the value of "x1(5)," and keeps the result "2*x1(5)=x1(16)" in data register "d0;" and "add d1,d1,d1" executes "Mul_2" on the value of "x1(9)," and keeps the result "2*x1(9)" in data register "d1."

The above filter operation is summarized is step 36 in FIG. 5.

6. During cycle 5, SC140 executes the following instruction code (line 28 in FIG. 2): "add d0,d1,d10 add d2,d2,d2 add d3,d3,d3 tfr d10,d7" where:

"add d0,d1,d10" executes "2*x1(5)+2*x1(9)=2*x1(10)," and keeps the result in data register "d10,"

"add d2,d2,d2" executes "2*x1(13)," and keeps the result in data register "d2,"

"add d3,d3,d3" executes "2*x1(18)," and keeps the result in data register "d3," and "tfr d10,d7" transfers the current state "$w_2(n-1)$=xs(4)" from data register "d10" to data register "d7," which becomes the state "$w_2(n-2)$" for the next input sample.

The above filter operation is summarized in step 37 of FIG. 5.

7. During cycle 6, SC140 executes the following instruction code (line 30 in FIG. 2): "add d10,d2,d6 tfr d0,d4 move.f(r1),d5" where:

"add d10,d2,d6" performs "2*x1(10)+2*x1(13)=2*x1(14)=x1(15)," and keeps the result in data register "d6."
    The value of "xs(3)" is in the higher 16 bits of data register "d6." The value of xs(3) is used to update the state "$w_2(n-1)$;"

"tfr d0,d4" transfers the value of "x1(16)" from data register "d0" to data register "d4." The value of "xs(1) is kept in the higher 16 bits of data register "d4." The value of "xs(1)" updates the state $w_1(n-2)$. This operation puts the value of "xs(1)" in the correct order for updating the 4 states $w_1(n-1)$, $w_1(n-2)$, $w_2(n-1)$, and $w_2(n-2)$ in one SC140 instruction "moves.4f d4;d5;d6;d7,(r1);" and "move.f(r1),d5" loads the current state "$w_1(n-1)$=xs(2)" into data register "d5" to update the state for next input sample. The sample "$w_1(n-1)$" will become "$w_1(n-2)$" for the next input sample.

The above filter operation is summarized in step 38 of FIG. 5.

8. During cycle 7, SC140 executes the following instruction code (line 32 in FIG. 2): "add d6,d3,d0 moves.4f d4:d5:d6:d7,(r1)" where:

"add d6,d3,d0" performs "2*x1(14)+2*x1(18)=2*x1(19)=x1(20)," the higher 16 bits of the value of "x1(20)" or data register "d0" keeps the filter output "y(n);" and "moves.4f d4:d5:d6:d7,(r1)" saves the 4 new states $w_1(n-1)$, $w_1(n-2)$,$w_2(n-1)$, and $w_2(n-2)$ in the memory pointed to by pointer register "r1."

The above filter operation is summarized in step 39 of FIG. 5.

As mentioned above, the StarCore SC140 DSP has four DALUs and two AGUs. Unfortunately, the kernel code illustrated and described above in the context of FIG. 2 is not able to fully utilize all the available functional units. This is because of a bottleneck condition that is known to occur in the updating operation of the $w_2(n-1)$ state which is evidenced by the fact that the conventional IIR filter of FIG. 3 requires seven clock cycles per input sample to execute. This bottleneck is illustrated in the data flow (or dependency) of FIG. 6. As shown, each of the seven operations executed for an input sample can only be performed when the result from the lower level operation becomes available. As seen from the data flow, there are seven levels of dependency for FIG. 3. This means that at least seven clock cycles are needed to filter one sample. To reduce the number of clock cycles, this operation dependency must be broken. However, attempting to break this dependency introduces the problem of updating the $w_2(n-1)$ state, which will not be available until the sixth cycle and therefore will not be updated until the seventh cycle, in accordance with the conventional filter implementation.

Accordingly, there is a need for a cascaded biquad IIR filter structure that overcomes such a bottleneck condition and thus increases the processing speed of the DSP or other processing circuitry with which it is implemented.

SUMMARY OF THE INVENTION

The present invention provides an improved cascaded biquad IIR filter structure which, among other advantages, overcomes the bottleneck condition described above, thus increasing the processing speed of the DSP or other processing circuitry with which it is implemented, such as, for example, an integrated circuit.

In one aspect of the invention, apparatus for performing such improved infinite impulse response (IIR) filtering comprises a first infinite impulse response filtering stage, at least a second infinite impulse response filtering stage, and an intermediate storage element operatively coupled between the first and second filtering stages. The first filtering stage includes one or more storage elements, the one or more storage elements being operative to store, in accordance with the filtering of a current input sample, one or more feedback state values associated with one or more input samples which precede the current input sample. In a second order IIR filter, these feedback state values include $w_1(n-1)$ and $w_1(n-2)$. The second infinite impulse response filtering stage also includes one or more storage elements, the one or more storage elements being operative to store, in accordance with the filtering of the current input sample, one or more feedback state values associated with one or more input samples which precede the current input sample. In a second order IIR filter, these feedback state values include $w_2(n-1)$ and $w_2(n-2)$. The intermediate storage element is operative to store, in accordance with the filtering of the current input sample, a partial state value useable to update at least one feedback state value associated with the second filtering stage for the filtering of a next input sample. The partial state value may be a function of at least one feedback state value associated with the current input sample and the input sample preceding the current input sample.

The first and second filtering stages may each preferably comprise: (i) a first storage element (e.g., one or more data registers), the first storage element being operative to store, in accordance with the current input sample, a feedback state value (e.g., $w_1(n-1)$ for the first filtering stage and $w_2(n-1)$ for the second filtering stage) associated with an input sample which precedes the current input sample; and (ii) at least a second storage element (e.g., one or more data registers), the second storage element being operative to store, in accordance with the current input sample, a feedback state value (e.g., $w_1(n-2)$ for the first filtering stage and $w_2(n-2)$ for the second filtering stage) associated with an input sample which precedes the input sample preceding the current input sample. Thus, if "n" is the current input sample, then "n-1" is the input sample which precedes the current input sample, and "n-2" is the input sample which precedes the input sample preceding the current input sample. In such case, the partial state value to be stored in the intermediate storage element (e.g., one or more data registers) may be a function of the feedback state values associated with the first and second storage elements of the first filtering stage and the second storage element of the second filtering stage. Accordingly, the partial state value may be used to update the feedback state value associated with the first storage element of the second filtering stage.

In one illustrative very long instruction word (VLIW) digital signal processor-implemented embodiment of the invention, one or more advantages of the invention may be achieved by adding a single 32-bit intermediate state to the data flow of a cascaded biquad IIR filter thus providing a cascaded biquad IIR filter structure wherein the $w_2(n-1)$ state may be updated no more than one cycle after the availability of preceding feedback state value updates associated with the first filtering stage. Thus, for example, in a StarCore SC140 implementation where a corresponding conventional cascaded biquad IIR filter structure executes at seven clock cycles per input sample, the improved cascaded biquad IIR filter structure of the present invention executes at six clock cycles per input sample. Therefore, without losing any precision, the kernel cycle count associated with the improved cascaded biquad IIR filter structure is advantageously reduced by 14 percent. Such a reduction in kernel count translates to a proportional increase in the processing speed of the DSP or other processing circuitry with which it is implemented.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 2 is SC140 kernel code for the conventional fixed-point cascaded biquad infinite impulse response filter structure shown in FIG. 1;

FIG. 8 is SC140 kernel code for the fixed-point cascaded biquad infinite impulse response filter structure shown in FIG. 7;

DETAILED DESCRIPTION OF PREFERRED EMBODIMENTS

The present invention will be explained below in the context of an illustrative cascaded biquad IIR filter implementation for the StarCore SC140 DSP. However, it is to be understood that the present invention is not so limited. Rather, as will be explained below, the concepts for forming a cascaded biquad IIR filter structure according to the invention may be more generally applied to other DSPs, as well as other processing circuitry with which the novel filter structure may be implemented, such as, for example, an integrated circuit. Also, while the illustrative embodiments described herein explain the invention in the context of a two stage fourth-order IIR filter implementation, it is to be appreciated that the teachings of the invention may be easily extended to IIR filter implementations with more stages for higher-order transfer functions.

Figure 7:
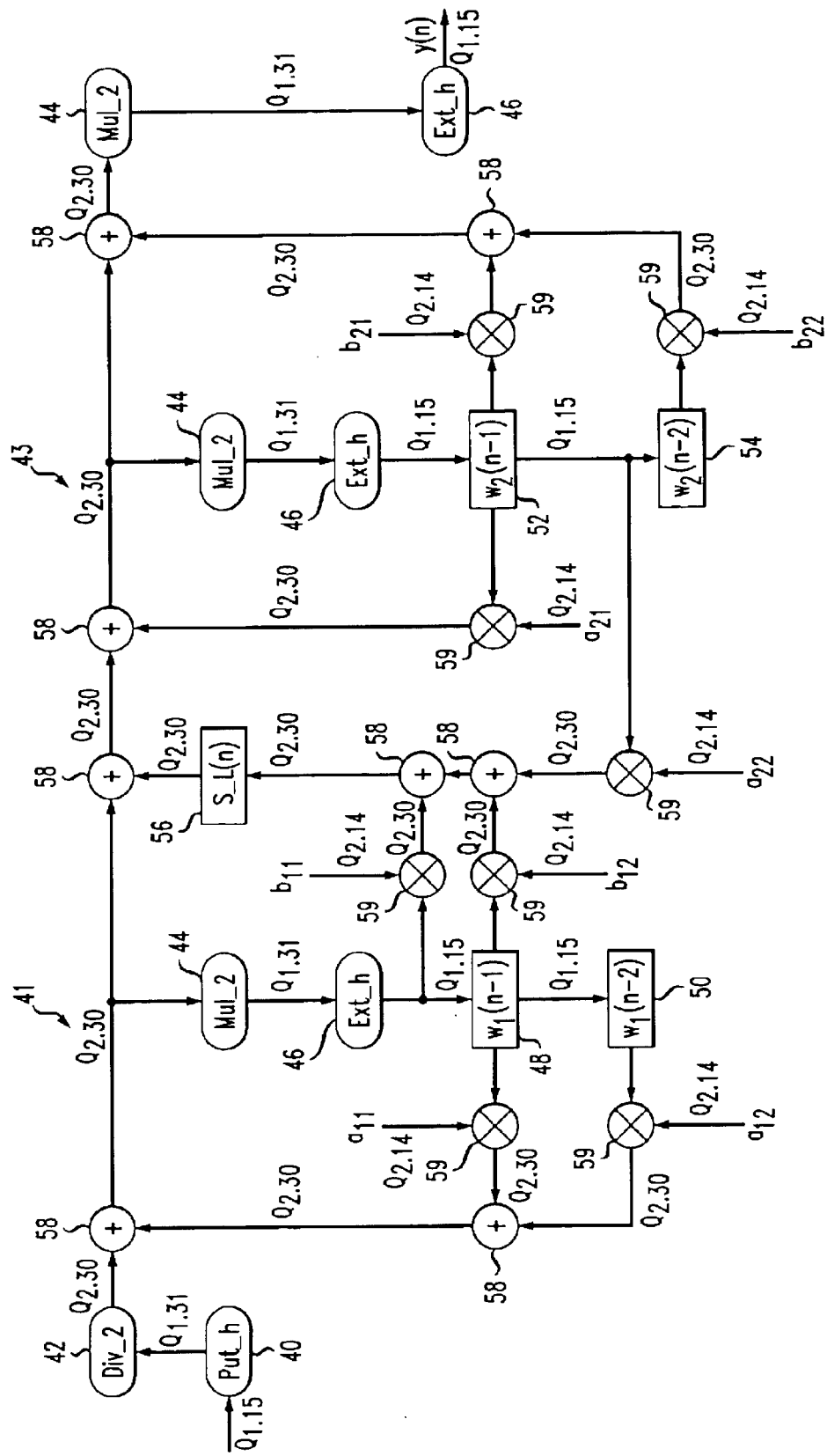
FIG. 7 is a diagram illustrating a fixed-point structure of a cascaded biquad infinite impulse response filter according to an embodiment of the present invention.

Referring now to FIG. 7, a diagram illustrates a fixed-point structure of a cascaded biquad infinite impulse response filter according to an embodiment of the present invention. It is to be appreciated that the improved cascaded biquad IIR filter structure of the invention, among other advantages, overcomes the bottleneck condition known to occur in the updating operation of the $w_2(n-1)$ state of a conventional cascaded biquad IIR filter, as described above. As will be explained below, this is accomplished by adding a single 32-bit intermediate state thus providing a new cascaded biquad IIR filter structure such that the $w_2(n-1)$ state may be updated one clock cycle earlier. Thus, the new IIR filter structure illustrated in FIG. 7 still implements the transfer function denoted in equation (1) above. Again, both the poles and the zeros of H(z) are restricted to be inside the unit circle meaning that coefficients $b_{i1}$, $b_{i2}$, $a_{i1}$, $a_{i2}$ will be in the range of [−2, 2]. Also, like above, since the improved filter is a fixed-point implementation, a (m+n) bit number is represented in a $Q_{m,n}$ format.

Similar to the above description of the conventional IIR filter, it is to be understood that certain of the filter operations of the new IIR filter are first generally described below in the context of FIG. 7 and then all filter operations are described in detail in the context of FIG. 9 with respect to the instruction code shown in FIG. 8. Thus, with reference to FIG. 7, the "Put_h" operation (reference numeral 40 in FIG. 7) deposits the 16 bit value into the higher 16 bits of the 32 bit register. The "Div_2" operation (reference numeral 42 in FIG. 7) scales down a 32 bit value by one bit. The "Mul_2" (reference numeral 44 in FIG. 7) operation scales up a 32 bit value by one bit. The "Ext_h" operation (reference numeral 46 in FIG. 7) extracts the higher 16 bits of a 32 bit value. Further, $w_1(n-1)$, $w_1(n-2)$, $w_2(n-1)$, and $w_2(n-2)$ (denoted by reference numerals 48, 50, 52 and 54, respectively, in FIG. 7) are the four 16-bit feedback state values for the cascaded biquad IIR filter. In addition, the new IIR filter structure includes a 32-bit intermediate filter state "S_L(n)" (reference numeral 56 in FIG. 7). The intermediate state keeps a partial result for the next filtering sample, pre-calculated in the current filtering sample. In terms of memory location, the location of the 4 byte "S_L(n)" is immediately after the 4 states $w_1(n-1)$, $w_1(n-2)$, $w_2(n-1)$, and $w_2(n-2)$). It is to be understood that FIG. 7 actually contains two biquad IIR filter stages 41 and 43. The two filter stages 41 and 43 are in a cascaded configuration, thus forming a cascaded biquad IIR filter.

Advantageously, as will be illustrated below, when the new fixed-point structure is used to implement the IIR filter, an SC140 DSP takes six cycles to execute per input sample. The corresponding SC140 assembly code is shown in FIG. 8. It is to be understood that the code shown in FIG. 8 is the optimized SC140 kernel code when the fixed-point structure shown in FIG. 7 is used to implement the IIR filter. Register "r0" contains the address for the four $Q_{2.14}$ format filter coefficients. Register "r1" contains the address for the four $Q_{1.15}$ format filter states. As mentioned, execution of this kernel code takes six cycles per input sample.

Figure 9:
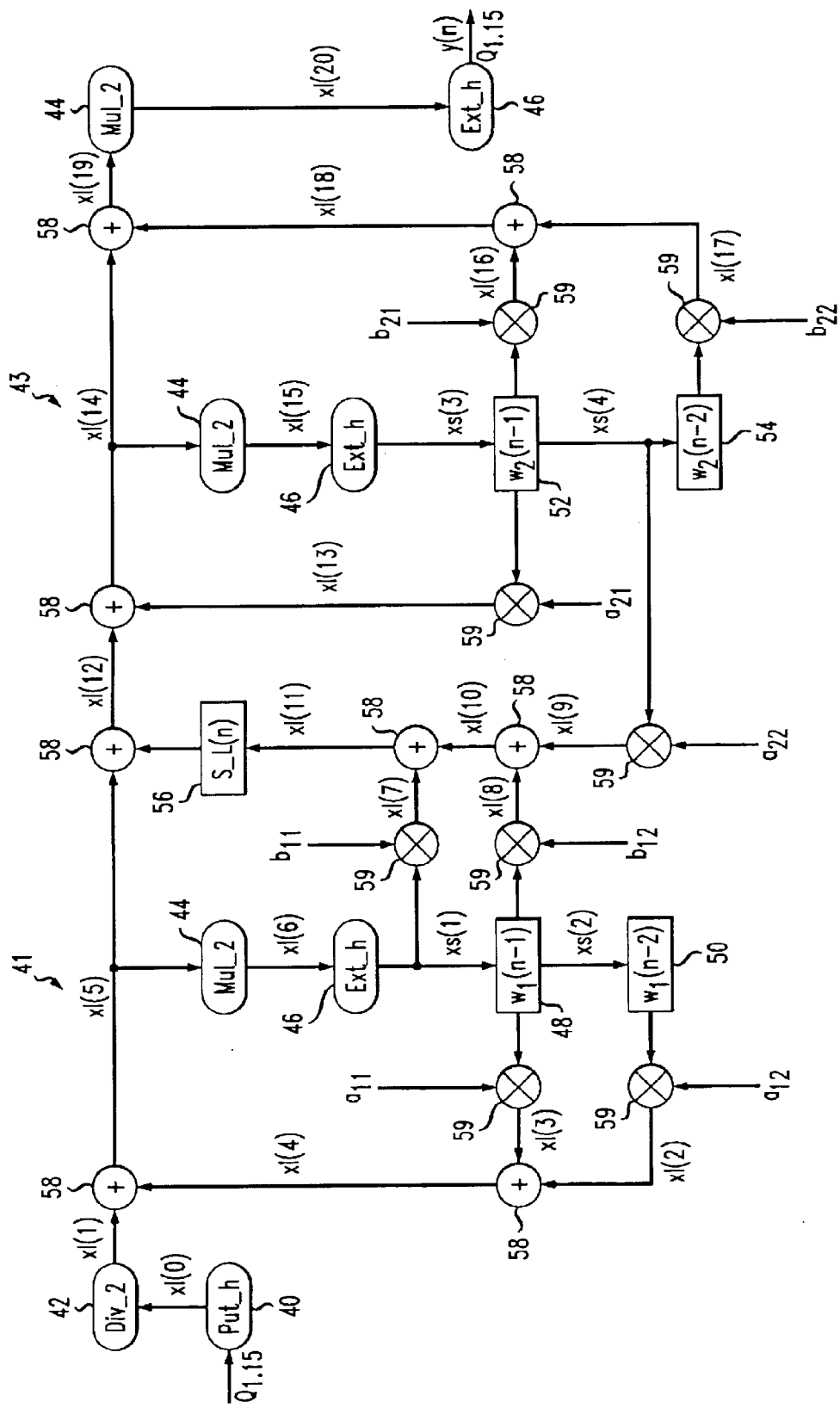
FIG. 9 is a flow diagram illustrating the data flow of the fixed-point cascaded biquad infinite impulse response filter structure shown in FIG. 7.

In order to explain the data flow associated with the execution of the optimized assembly code of FIG. 8, the nomenclature associated with the filter structure of FIG. 7 is modified, as shown in FIG. 9. Thus, FIG. 9 represents a flow diagram illustrating the data flow of the fixed-point cascaded biquad IIR filter structure shown in FIG. 7. Again, as above, it is to be appreciated that x1(i) denotes that the data is 32 bit long, and xs(i) denotes that the data is 16 bit long.

Figure 4:
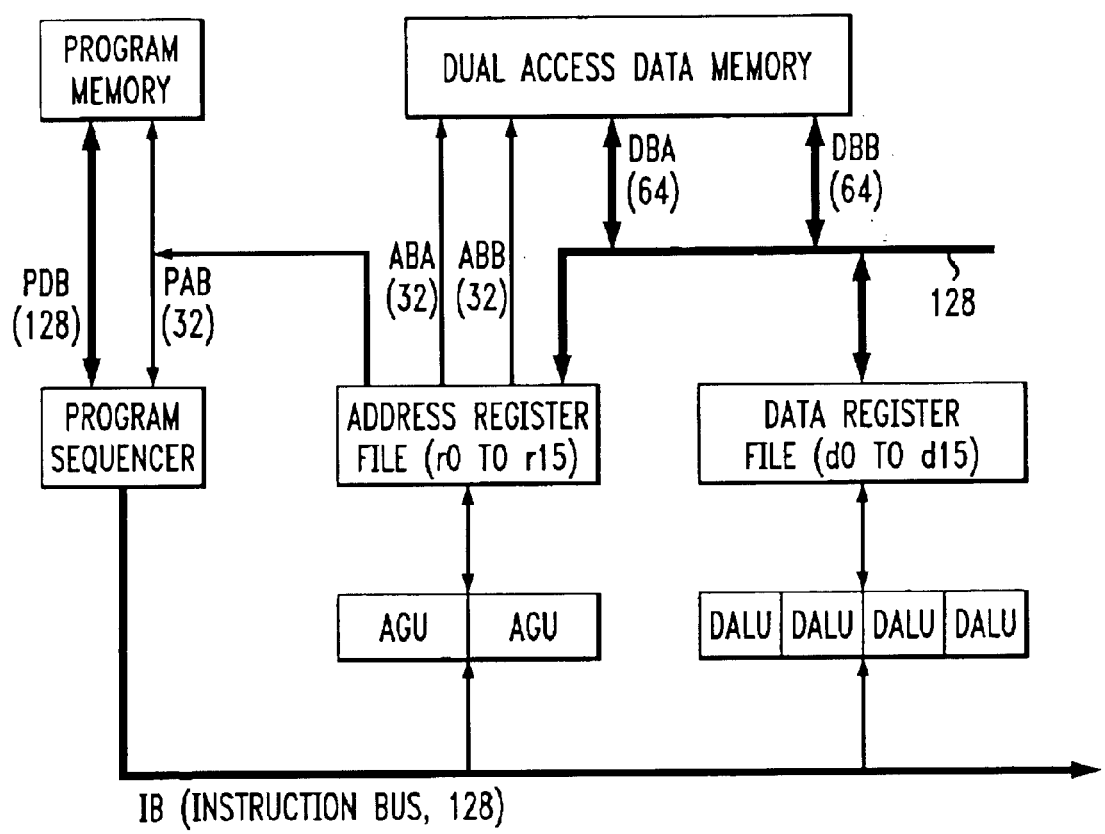
FIG. 4 is a simplified block diagram illustrating the StarCore SC140 digital signal processor.
Figure 5:
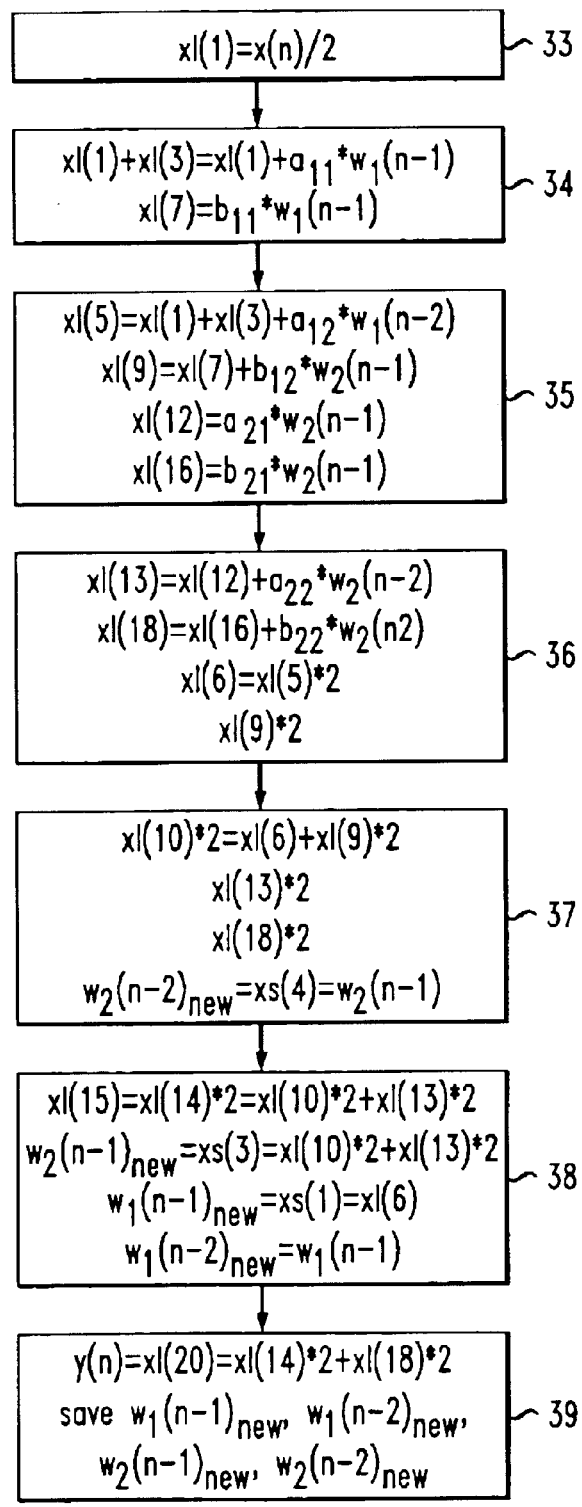
FIG. 5 is a flow diagram summarizing the operations of the conventional filter structure of FIG. 3.
Figure 6:
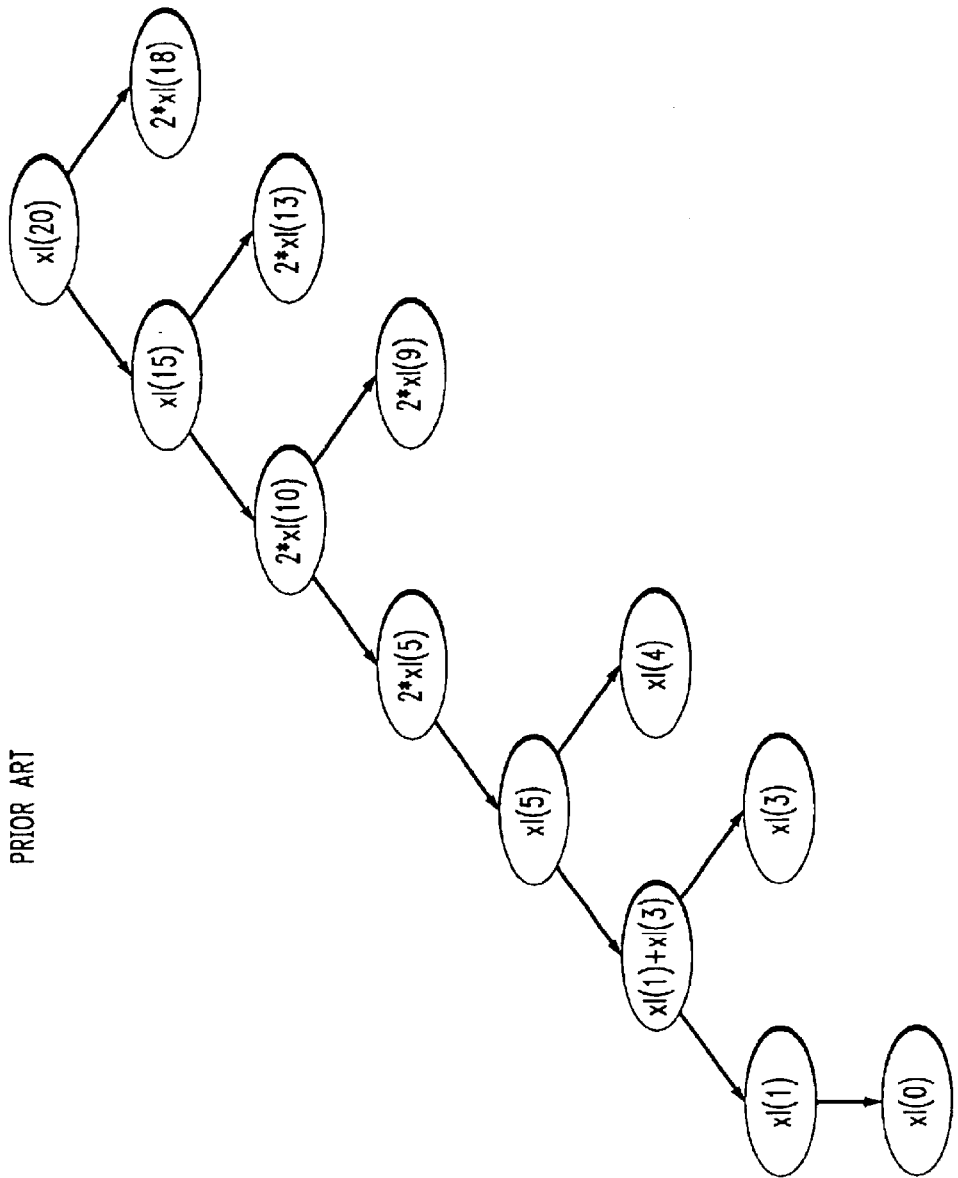
FIG. 6 is a flow diagram illustrating the dependency associated with the conventional filter structure of FIG. 3.

The following is the detailed analysis of the execution of the assembly code. In accordance with the following explanation of FIG. 9, again, it is to be understood that d0, d1, ..., d15 are the SC140 DSP's data registers, and r0 and r1 are the pointer registers (as illustrated in FIG. 4). Further, it is to be again understood that the functionality of the adders (each denoted by reference numeral 58 in FIG. 9) and the multipliers (each denoted by reference numeral 59 in FIG. 9) are apparent in the description below of the operation of the IIR filter structure of FIG. 9 when executing the code in FIG. 8. That is, an addition operation provided by an adder 58 is denoted below as "+", while a multiplication operation provided by a multiplier 59 is denoted below as "*". Also, during the description below, reference will be made to FIG. 10, which is a flow diagram summarizing the operation of each step of the filtering process.

1. Initially, data register "d0" holds the value of "x1(0)." The pointer register "r0" points address where the eight coefficient values, $b_{11}$, $b_{12}$, $a_{11}$, $a_{12}$, $b_{21}$, $b_{22}$, $a_{21}$, and $a_{22}$, are held. The pointer register "r1" points to the address where the four 16-bit state values, $w_1(n-1)$, $w_1(n-2)$, $w_2(n-1)$, $w_2(n-2)$, and one 32-bit intermediate state, S_L(n), are held.

2. During cycle 1, SC140 executes the following instruction code (line 60 in FIG. 8): "asr d0,d0 move.4f(r0)+, d4:d5:d6:d7 move.4f(r1)+,d8:d9:d10:d11" where:

"asr d0,d0" executes the "Div_2" operation and data register "d0" holds the value "x1(1);"

"move.4f(r0)+,d4:d5:d6:d7" loads $b_{11}$, $b_{12}$, $a_{11}$, and $a_{12}$ to data registers "d4," "d5," "d6," and "d7;" and move.4f(r1),d8:d9:d10:d11" loads the 4 states $w_1(n-1)$, $w_1(n-2)$, $w_2(n-1)$, and $w_2(n-2)$ to data registers "d8," "d9," "d10," and "d11."

Figure 10:
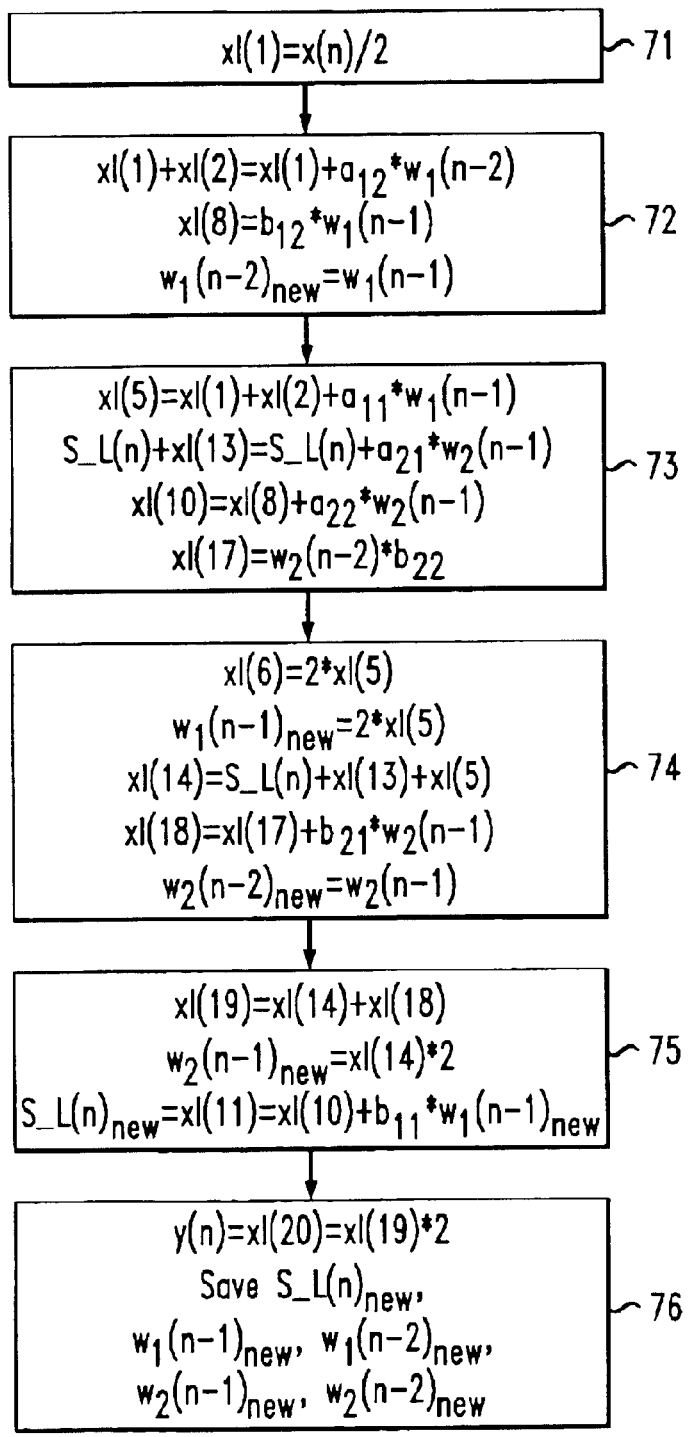
FIG. 10 is a flow diagram summarizing the operations of the inventive filter structure of FIG. 7.

The above filter operation is summarized in step 71 of FIG. 10.

3. During cycle 2, SC140 executes the following instruction code (line 62 in FIG. 8): "mac d7,d9,d0 mpy d5,d8,d3 tfr d8,d9 move.1(r1),d2 move.4f(r0),d12:d13:d14:d15" where:

"mac d7,d9,d0" executes "$x1(1)+a_{12}*w_1(n-2)=x1(1)+x1(2)$," and keeps the result in data register "d0;"

"mpyd5,d8,d3" executes "$b_{12}*w_1(n-1)=x1(8)$," and keeps the result in data register "d3;"

"tfr d8,d9" transfers "$w_1(n-1)$" from data register "d8" to data register "d9" for updating the four states in the future;

move.1(r1),d2" loads the pre-calculated partial filtering result to data register "d2." This partial filtering result is calculated during the previous input sample filtering. After the data fetch, pointer register "r1" still points to the address of the intermediate state "S_L(n);" and "move.4f(r0),d12:d13:d14:d15" loads $b_{21}$, $b_{22}$, $a_{21}$, and $a_{22}$ to data registers "d12," "d13," "d14," and "d15."

The above filter operation is summarized in step 72 of FIG. 10.

4. During cycle 3, SC140 executes the following instruction code (line 64 in FIG. 8): "mac d6,d8,d0 mac d14,d10,d2 mac d15,d10,d3 mpy d13,d11,d1 tfra r1,r0" where:

"mac d6,d8,d0" performs "$x1(1)+x1(2)+a_{11}*w_1(n-1)=x1(1)+x1(2)+x1(3)=x1(5)$," and keeps the result in data register "d0;"

"mac d14,d10,d2" performs "$S\_L(n)+a_{21}*w_2(n-1)=S\_L(n)+x1(13)$," and keeps the result in data register "d2;"

"mac d15,d10,d3" performs "$x1(8)+a_{22}*w_2(n-1)=x1(8)+x1(9)=x1(10)$," and keeps the result in data register "d3;"

"mpy d13,d11,d1" performs "$b_{22}*w_2(n-2)=x1(17)$," and keeps the result in data register "d1;" and "tfra r1,r0" copies the address in pointer register "r1" to pointer register "r0."

The above filter operation is summarized in step 73 of FIG. 10.

5. During cycle 4, SC140 executes the following instruction code (line 66 in FIG. 8): "add d0,d0,d8 add d0,d2,d2 mac d12,d10,d1 tfr d10,d11 suba #8,r0" where:

"add d0,d0,d8" performs "$2*x1(5)=x1(6)$," or the "Mul_2" operation. The result is kept in data register "d8." The higher 16-bit value of data register "d8" contains the value of "xs(1)," which will be used to update the filter state and pre-compute the partial filtering result;

"add d0,d2,d2" performs "$x1(5)+S\_L(n)+x1(13)=x1(14)$," and keeps the results in data register "d2;"

"mac d12,d10,d1" performs "$x1(17)+b_{21}*w_2(n-1)=x1(17)+x1(16)=x1(18)$," and keeps the results in data register "d1;"

"tfr d10,d11" transfers "$w_2(n-1)$" from data register "d10" to data register "d11" for updating the filter states; and "suba #8,r0" updates the pointer register "r0" so it points to the beginning of the 4 state ($w_1(n-1)$, $w_1(n-2)$, $w_2(n-1)$, and $w_2(n-2)$) memory locations.

The above filter operation is summarized in step 74 of FIG. 10.

6. During cycle 5, SC140 executes the following instruction code (line 68 in FIG. 8): "add d2,d1,d0 add d2,d2,d10 mac d4,d8,d3" where:

"add d2,d1,d0" performs "$x1(14)+x1(18)=x1(19)$," and keeps the results in data register "d0;"

"add d2,d2,d10" performs "$2*x1(14)=x1(15)$" or the "Mul_2" operation. The higher 16 bits of the value of "x1(15)" contains "xs(3)," which will be used to update the filter states; and "mac d4,d8,d3" performs "$x1(10)+b_{11}*xs(1)=x1(11)$," which will be used to update the intermediate state "S_L(n)." The data register "d3" keeps the result.

The above filter operation is summarized in step 75 of FIG. 10.

7. During cycle 6, SC140 executes the following instruction code (line 70 in FIG. 8): "add d0,d0,d0 move.1d3,(r1) moves.4f d8:d9:d10:d11,(r0)" where:

"add d0,d0,d0" performs "$2*x1(19)=x1(20)$," or the "Mul_2" operation, the higher 16 bits of the value of "x1(20)" or data register "d0" keeps the filter output "y(n);"

"move.1 d3,(r1)" updates the intermediate state "S_L(n);" and

"moves.4fd8:d9:d10:d:11,(r0)" saves the 4 new states $w_1(n-1)$, $w_1(n-2)$, $w_2(n-1)$, and $w_2(n-2)$ in the memory pointed to by pointer register "r0."

The above filter operation is summarized in step 76 of FIG. 10.

Figure 1:
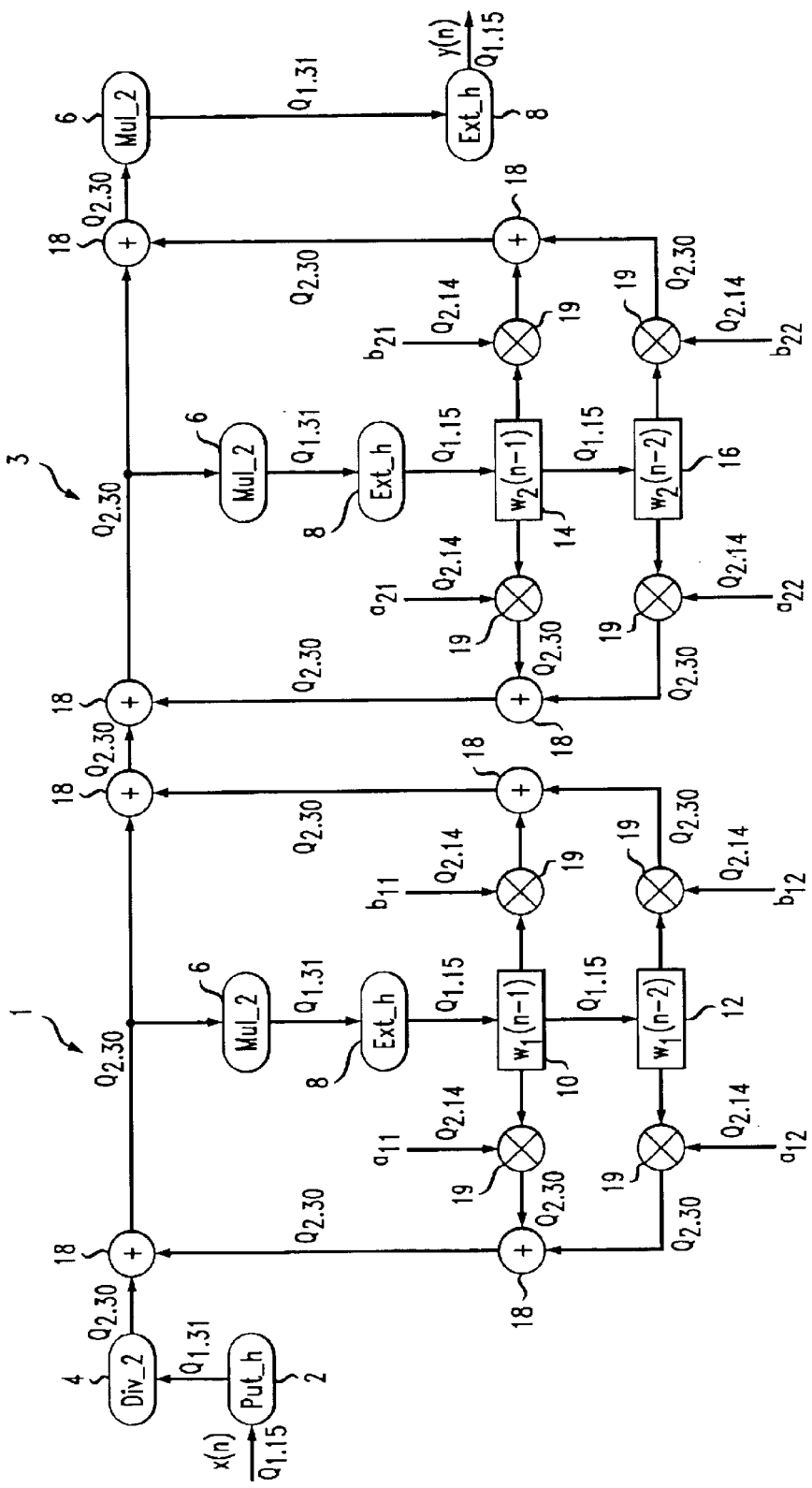
FIG. 1 is a diagram illustrating a conventional fixed-point structure of a cascaded biquad infinite impulse response filter.
Figure 3:
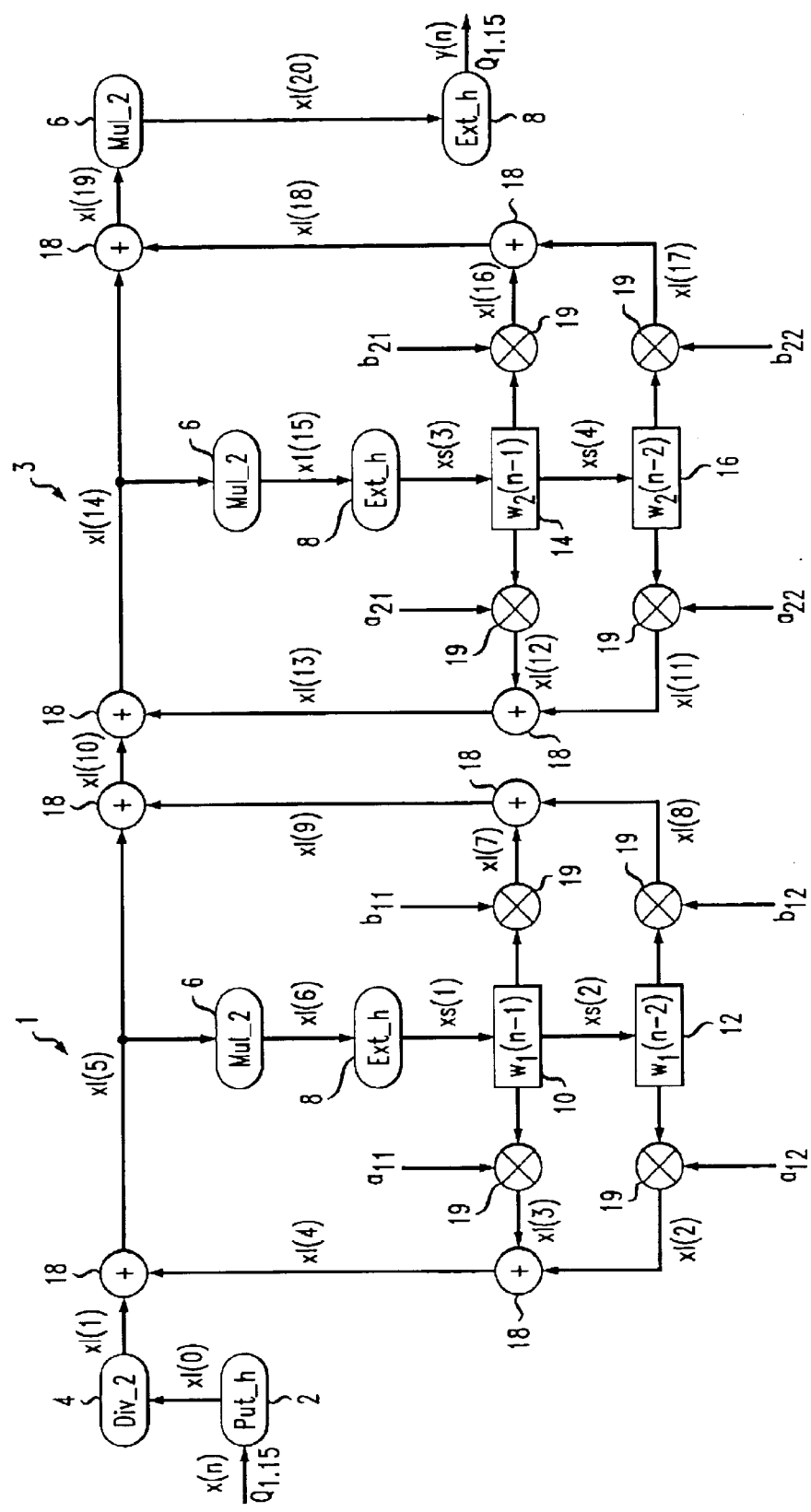
FIG. 3 is a flow diagram illustrating the data flow of the conventional fixed-point cascaded biquad infinite impulse response filter structure shown in FIG. 1.
Figure 11:
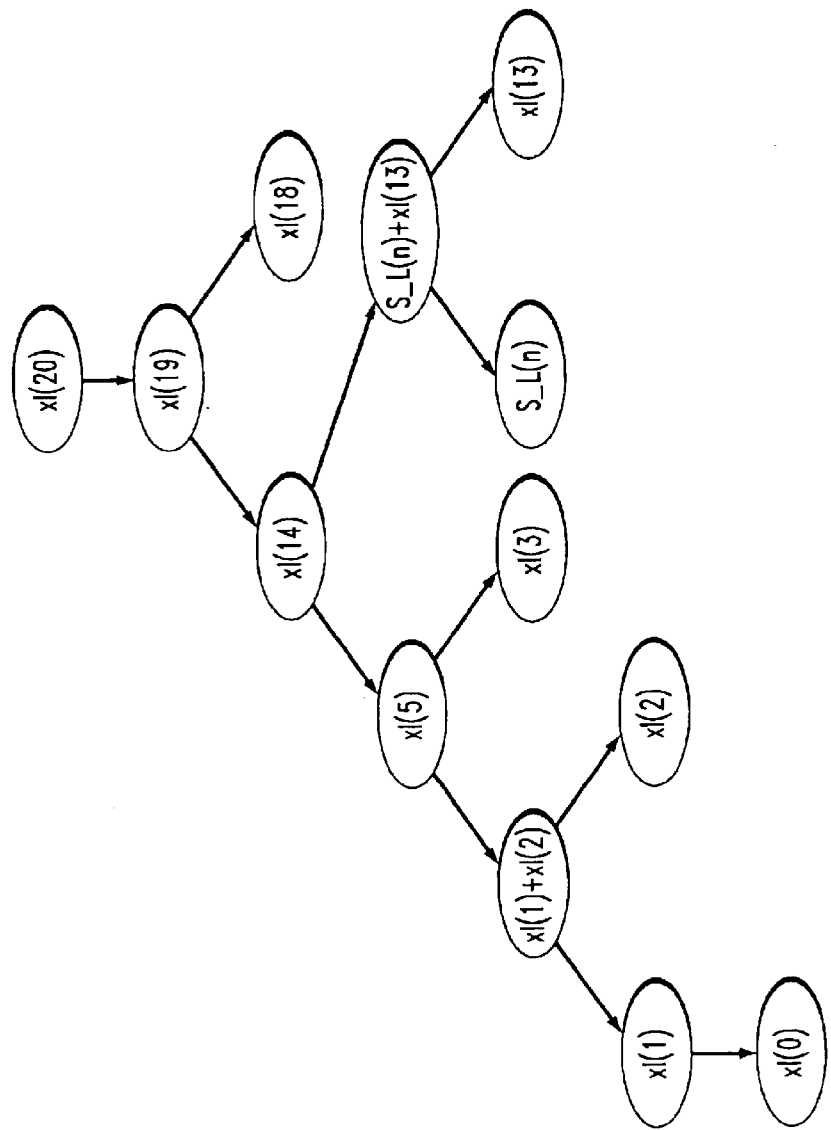
FIG. 11 is a flow diagram illustrating the dependency associated with the inventive filter structure of FIG. 7.

Accordingly, while the conventional filter structure of FIG. 3 and the inventive filter structure of FIG. 9 perform a similar filtering function defined as:

$$y(n)=(x(n)/2+w_1(n-1)*a_{11}+w_1$$

$$(n-2)*a_{12}+w_1$$

$$(n-1)*b_{11}+w_1$$

$$(n-2)*b_{12}+w_2$$

$$(n-1)*a_{21}+w_2$$

$$(n-2)*a_{22}+w_2$$

$$(n-1)*b_{21}+w_2$$

$$(n-2)*b_{22})*2$$

$$w_1(n-2)_{new}=w_1(n-1)$$

$$w_1(n-1)_{new}=(x(n)/2+w_1$$

$$(n-1)*a_{11}+w_1$$

$$(n-2)*a_{12})*2$$

$$w_2(n-2)_{new}=w_2(n-1)$$

$$w_2(n-1)_{new}=(x(n)/2+w_1$$

$$(n-1)*a_{11}+w_1(n-2)*a_{12}+w_1$$

$$(n-1)*b_{11}+w_1(n-2)*b_{12}+w_2$$

$$(n-1)*a_{21}+w_2(n-2)*a_{22})*2$$

the dependency lengths associated with the inventive filter structure are advantageously reduced to six, as is illustrated in the dependency diagram of FIG. 11. Thus, as illustrated in the above SC140 DSP implementation, the improved cascaded biquad IIR filter structure of the present invention executes at six clock cycles per input sample. As compared with the corresponding conventional cascaded biquad IIR filter structure, which executes at seven cycles per input sample, the kernel cycle count associated with the improved cascaded biquad IIR filter structure is advantageously reduced by 14 percent, without losing any precision. Such a reduction in kernel count translates to a proportional increase in the processing speed of the DSP, i.e., in this example, the StarCore SC140.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. Apparatus for performing infinite impulse response filtering, the apparatus comprising:

a first infinite impulse response filtering stage, the first filtering stage including one or more storage elements, the one or more storage elements being operative to store, in accordance with the filtering of a current input sample, one or more feedback state values associated with one or more input samples which precede the current input sample; and at least a second infinite impulse response filtering stage, the second filtering stage being operatively coupled to the first filtering stage and including one or more storage elements, the one or more storage elements being operative to store, in accordance with the filtering of the current input sample, one or more feedback state values associated with one or more input samples which precede the current input sample; and an intermediate storage element, the intermediate storage element being operatively coupled between the first filtering stage and the second filtering stage and operative to store, in accordance with the filtering of the current input sample, a partial state value useable to update at least one feedback state value associated with the second filtering stage for the filtering of a next input sample, the partial state value being a function of at least one feedback state value associated with the current input sample and the input sample preceding the current input sample.

2. The apparatus of claim 1, wherein the first filtering stage comprises:

a first storage element, the first storage element being operative to store, in accordance with the current input sample, a feedback state value associated with an input sample which precedes the current input sample; and at least a second storage element, the second storage element being operative to store, in accordance with the current input sample, a feedback state value associated with an input sample which precedes the input sample preceding the current input sample.

3. The apparatus of claim 2, wherein the second filtering stage comprises:

a first storage element, the first storage element being operative to store, in accordance with the current input sample, a feedback state value associated with an input sample which precedes the current input sample; and at least a second storage element, the second storage element being operative to store, in accordance with the current input sample, a feedback state value associated with an input sample which precedes the input sample preceding the current input sample.

4. The apparatus of claim 3, wherein the partial state value to be stored in the intermediate storage element is useable to update the feedback state value associated with the first storage element of the second filtering stage.

5. The apparatus of claim 3, wherein the partial state value to be stored in the intermediate storage element is a function of the feedback state values associated with the first and second storage elements of the first filtering stage and the second storage element of the second filtering stage.

6. The apparatus of claim 3, wherein the partial state value associated with the intermediate storage element enables the update of the feedback state value associated with the first storage element of the second filtering stage no more than one cycle after the availability of preceding feedback state value updates associated with the first filtering stage.

7. The apparatus of claim 1, wherein the storage elements are implemented in accordance with a digital signal processor.

8. The apparatus of claim 7, wherein the digital signal processor is a very long instruction word type digital signal processor.

9. The apparatus of claim 1, wherein the storage elements are implemented in accordance with an integrated circuit.

10. A method of performing infinite impulse response filtering, the method comprising the steps of:

storing one or more feedback state values associated with one or more input samples which precede a current input sample in one or more storage elements of a first infinite impulse response filtering stage;

storing one or more feedback state values associated with one or more input samples which precede the current input sample in one or more storage elements of a second infinite impulse response filtering stage;

storing a partial state value in an intermediate storage element operatively coupled between the first filtering stage and the second filtering stage, the partial state value being a function of at least one feedback state value associated with the current input sample and the input sample preceding the current input sample; and using the partial state value to update at least one feedback state value associated with the second filtering stage for the filtering of a next input sample.

11. The method of claim 10, wherein the first filtering stage comprises:

a first storage element, the first storage element being operative to store, in accordance with the current input sample, a feedback state value associated with an input sample which precedes the current input sample; and at least a second storage element, the second storage element being operative to store, in accordance with the current input sample, a feedback state value associated with an input sample which precedes the input sample preceding the current input sample.

12. The method of claim 11, wherein the second filtering stage comprises:

a first storage element, the first storage element being operative to store, in accordance with the current input sample, a feedback state value associated with an input sample which precedes the current input sample; and at least a second storage element, the second storage element being operative to store, in accordance with the current input sample, a feedback state value associated with an input sample which precedes the input sample preceding the current input sample.

13. The method of claim 12, wherein the partial state value to be stored in the intermediate storage element is used to update the feedback state value associated with the first storage element of the second filtering stage.

14. The method of claim 12, wherein the partial state value being stored in the intermediate storage element is a function the feedback state values associated with the first and second storage elements of the first filtering stage and the second storage element of the second filtering stage.

15. The method of claim 12, wherein the storing of the partial state value enables the update of the feedback state value associated with the first storage element of the second filtering stage no more than one cycle after the availability of preceding feedback state value updates associated with the first filtering stage.

16. The method of claim 10, wherein the storage elements are implemented in accordance with a digital signal processor.

17. The method of claim 16, wherein the digital signal processor is a very long instruction word type digital signal processor.

18. The method of claim 10, wherein the storage elements are implemented in accordance with an integrated circuit.

19. A digital signal processor-implemented cascaded biquad infinite impulse response filter, the filter comprising:

a first infinite impulse response filtering stage, the first filtering stage including:

a first storage element, the first storage element being operative to store, in accordance with the filtering of a current input sample, a feedback state value associated with an input sample which precedes the current input sample; and at least a second storage element, the second storage element being operative to store, in accordance with the filtering of the current input sample, a feedback state value associated with an input sample which precedes the input sample preceding the current input sample at least a second infinite impulse response filtering stage, the second filtering stage being operatively coupled to the first filtering stage and including:

a first storage element, the first storage element being operative to store, in accordance with the filtering of the current input sample, a feedback state value associated with an input sample which precedes the current input sample; and at least a second storage element, the second storage element being operative to store, in accordance with the filtering of the current input sample, a feedback state value associated with an input sample which precedes the input sample preceding the current input sample; and an intermediate storage element, the intermediate storage element being operatively coupled between the first filtering stage and the second filtering stage and operative to store, in accordance with the filtering of the current input sample, a partial state value useable to update the feedback state value associated with the first storage element of the second filtering stage for the filtering of a next input sample, the partial state value being a function of the feedback state values associated with the first and second storage elements of the first filtering stage and the second storage element of the second filtering stage.

20. The filter of claim 19, wherein the partial state value associated with the intermediate storage element enables the update of the feedback state value associated with the first storage element of the second filtering stage no more than one cycle after the availability of preceding feedback state value updates associated with the first filtering stage.

* * * * *